(12) United States Patent
Lee et al.

(10) Patent No.: US 6,519,417 B2
(45) Date of Patent: Feb. 11, 2003

(54) SEMICONDUCTOR WAFER BAKING APPARATUS

(75) Inventors: Byung Il Lee, Seoul (KR); Dae Woo Lee, Uijeongbu (KR)

(73) Assignee: Unisem Co., Ltd. (KR)

( * ) Notice: Subject to any disclaimer, the term of this patent is extended or adjusted under 35 U.S.C. 154(b) by 0 days.

(21) Appl. No.: 09/891,811

(22) Filed: Jun. 26, 2001

(65) Prior Publication Data

US 2002/0066725 A1 Jun. 6, 2002

(30) Foreign Application Priority Data

Jun. 26, 2000 (KR) .......................................... 00-35307
Feb. 14, 2001 (KR) .......................................... 01-7323
Feb. 20, 2001 (KR) .......................................... 01-8477

(51) Int. Cl.[7] ................................................ F26B 3/30
(52) U.S. Cl. ...................... 392/418; 392/416; 219/390; 219/405; 219/411; 118/724; 118/725; 118/50.1
(58) Field of Search .............................. 219/390, 405, 219/411; 118/724, 725, 50.1; 392/416, 418

(56) References Cited

U.S. PATENT DOCUMENTS 4,493,977 A * 1/1985 Arai et al. .................. 219/411
4,535,228 A * 8/1985 Mimura et al. ............. 219/411
6,113,984 A * 9/2000 MacLeish et al. ..... 427/255.32

* cited by examiner

Primary Examiner—Teresa Walberg
Assistant Examiner—Shawntina T. Fuqua
(74) Attorney, Agent, or Firm—Cantor Colburn LLP

(57) ABSTRACT

The present invention discloses a semiconductor wafer baking apparatus comprising a heating plate, a wafer guide, and an exhaust heat compensator. The heating plate is loaded with a wafer and the wafer guide arranges the wafer on the heating plate. The exhaust heat compensator is placed on the wafer guide and compensates exhausted heat from an edge area of the wafer. The exhaust heat compensator comprises a penetration hole to expose a center portion of the wafer. Therefore, the semiconductor wafer baking apparatus according to the present invention compensates the heat loss occurring in the edge area of the wafer and keeps the edge area of the wafer from temperature drop, which results in a temperature uniformity on the wafer surface. By reducing the temperature deviation within a wafer, a uniform pattern size of an entire wafer in the semiconductor wafer manufacturing process is achieved so that the process reliability and the process yields can be improved.

16 Claims, 14 Drawing Sheets

----- TEMPERATURE ON HEATING PLATE
——— TEMPERATURE ON A WAFER

— TEMPERATURE ON A HEATING PLATE
----- TEMPERRATURE ON A WAFER
— COMPENSATED TEMPERATURE ON THE WAFER
—·· — TEMPERRATURE ON AN EXHAUST HEAT COMPENSATOR

TEMPERATURE DISTRIBUTIONS ON A 200mm WAFER SURFACE

——— Conventional wafer baking apparatus

——— 0.1mm (Distance)
Baking apparatus according to the present invention

TEMPERATURE DISTRIBUTIONS ON A 300mm WAFER SURFACE

——— Conventional wafer baking apparatus

——— 1mm (Distance)
Baking apparatus according to the present invention

SEMICONDUCTOR WAFER BAKING APPARATUS

BACKGROUND OF THE INVENTION

1. Field of the Invention

The present invention refers to a semiconductor manufacturing equipment, and more particularly, to a semiconductor wafer baking apparatus. The semiconductor wafer baking apparatus includes an exhaust heat compensator to compensate a temperature in an edge area of a wafer and to prevent a temperature drop in the edge area of the wafer while the wafer is baked at a desired temperature during manufacturing process thereof. The semiconductor wafer baking apparatus uniformly maintains the temperature of the wafer surface.

2. Description of Related Art

In semiconductor manufacturing processes, for example, a wafer baking process in a desired temperature after a photoresist coating process in photolithography, semiconductor wafers are treated one by one. The wafer baking process in a semiconductor manufacturing process includes a pre-coating bake, a soft bake, a post-exposed bake, and a hard bake. The pre-coating bake process eliminates moistures absorbed in a wafer before coating a photoresist. The soft bake process employing a heated hot plate heats a wafer to release a shear stress caused by coating the photoresist and a solvent. The post-exposed bake recovers instability in a chemical structure of the photoresist generated in an area developed by ultraviolet scattering. The hard bake solidifies the photoresist after a pattern developing process in a wafer.

Baking a semiconductor wafer employs a heating plate for heating a wafer. Then, the uniformity of a process temperature in a wafer determines the uniformity of a pattern size in the wafer.

FIG. 1 illustrates a configuration of a conventional wafer baking apparatus.

The conventional wafer baking apparatus includes a heating plate 1, a wafer supporter 2, a wafer guide 3, a chamber body 4, and a cover 5. The heating plate 1 heats a wafer W. The wafer supporter 2 keeps a distance between the wafer W and the heating plate 1. The wafer guide 3 enables a proper arrangement of the wafer W on the heating plate 1. The chamber body 4 surrounding the heating plate 1 and the wafer guide 3, moves up and down in vertical direction. The cover 5 placed in an upper side of the wafer guide 3 moves up and down in vertical direction. The chamber body 4 and the cover 5 stabilize temperatures and aerodynamic flows in the wafer baking apparatus.

The wafer supporter 2 is preferably a cylindrical type of the same size as the heating plate 1. The wafer supporter 2 is installed in the upper side of the heating plate 1 or includes a plurality of protrusions in the upper area of the heating plate 1. Preferably, the wafer supporter 2 loads a wafer in a distance of 100 to 200 μm spaced from the heating plate 1 and maintains the distance constantly and uniformly regardless of the position of the heating plate 1. One side of the wafer guide 3 contacting the wafer W forms a slope 3a. The conventional semiconductor baking apparatus as shown in FIG. 1 operates as follows.

The chamber body 4 moves down and the cover 5 moves up so that a wafer transfer arm (not shown in FIG. 1) can load the wafer W on the heating plate 1. Then, the slope 3a of the wafer guide 3 leads the wafer W to be placed on the wafer supporter 2 properly. After the wafer W is placed on the wafer supporter 2, the chamber body 4 moves up and the cover 5 moves down, so that the chamber body 4 and the cover 5 become in contact with each other. Then, the heat transferred from the heating plate 1 preheated to a temperature is used for baking the wafer W loaded on the wafer supporter 2.

After baking the wafer W at a constant temperature and for a predetermined time, the cover moves up and the chamber body 4 moves down so that the wafer transfer arm extracts the baked wafer W from the wafer supporter 2. Such a process is performed in repeat to bake another wafer.

However, the wafer W baked by the heat transferred from the heating plate 1 is exposed in the air and the heat transferred to the wafer W is exhausted to the air. Therefore, the temperature distribution of the wafer W is not uniform. In other words, as illustrated in FIG. 2, the heat exhausted from the edge area of the wafer W is more than that from the center area of the wafer W. Therefore, the temperature of the wafer W is lowered toward the edge area from the center area of the wafer W. As a result, uniform micro patterns in the wafer W can not be created precisely, and device characteristics between the center and the edge area of the wafer W are different from each other, which eventually results in a yield drop.

SUMMARY OF THE INVENTION

To overcome the above-described problems, preferred embodiments of the present invention provide a semiconductor wafer baking apparatus for preventing heat exhaustion from an edge area of a wafer and for uniformly maintaining temperatures of the wafer.

In order to achieve the above object, one aspect of the present invention provides a semiconductor wafer baking apparatus comprising a heating plate, a wafer guide, and an exhaust heat compensator. The heating plate is loaded with a wafer and the wafer guide properly arranges the wafer on or above the heating plate. The exhaust heat compensator is placed on the wafer guide and compensates exhausted heat from an edge area of the wafer. The exhaust heat compensator comprises a penetration hole exposes a center portion of the wafer.

In order to achieve the above object, another aspect of the present invention provides a semiconductor wafer baking apparatus comprising a heating plate, a wafer supporter, and an exhaust heat compensator. The heating plate is loaded with a wafer and heats the wafer to a predetermined temperature. The wafer supporter keeps a distance between the wafer and the heating plate so that the wafer does not contact directly with the heating plate. The exhaust heat compensator is placed on the top side of the heating plate to surround an edge area of the wafer to compensate the temperature of the edge area of the wafer.

BRIEF DESCRIPTION OF THE DRAWINGS

For a more complete understanding of the present invention and the advantages thereof, a preferred embodiment of the present invention will be described with reference to the attached drawings, in which like reference numerals denote like parts and.

DETAILED DESCRIPTION OF PREFERRED EMBODIMENTS

Reference will now be made in detail to preferred embodiments of the present invention.

Figure 3:
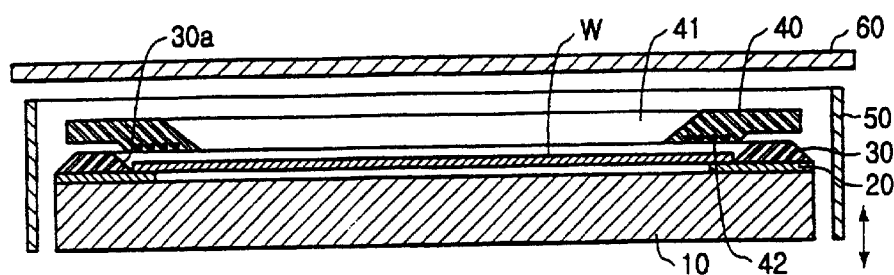
FIG. 3 illustrates a configuration of a baking apparatus according to a preferred embodiment of the present invention.
Figure 4:
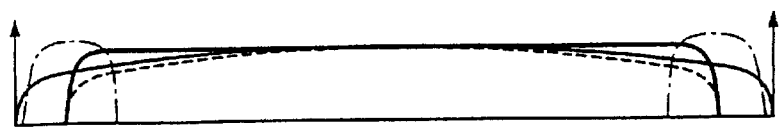
FIG. 4 illustrates temperature distributions in a wafer loaded in the baking apparatus as shown in FIG. 3.

FIG. 3 illustrates a configuration of a baking apparatus according to one preferred embodiment of the present invention The baking apparatus includes a heating plate 10, a wafer supporter 20, a wafer guide 30, an exhausting heat compensator 40, a chamber body 50, and a cover 60. The heating plate 10 heats a wafer W. The wafer supporter 20 keeps a predetermined distance between the wafer W and the heating plate 10 so that the wafer W cannot contact directly with the heating plate 10. The wafer guide 30 extends from an edge area of the wafer supporter 20 to an edge area of the wafer W loaded in the wafer supporter 20, and guides the wafer W to be properly placed on or above the heating plate 10. The wafer supporter 20 is preferably formed to be integrated with the wafer guide 30. The wafer guide 30 is provided with a slope 30a of a desired gradient in one side of the wafer guide 30 to be in contact with the wafer W. The exhaust heat compensator 40 is located spaced from an upper side of the wafer guide 30 and is preferably of the same size as the heating plate 10. The chamber body 50 surrounds the heating plate 10 and the exhaust heat compensator 40. The cover 60 is placed above the chamber body 50 and is movable up and down in vertical direction.

The exhaust heat compensator 40 is provided with a penetration hole 41 and is movable up and down and the penetration hole 41 exposes the wafer W to the air. The upper end diameter of the penetration hole 41 facing the cover 60 is larger than the lower end diameter of the penetration hole 41 facing the wafer W. Therefore, the diameter of the penetration hole 41 gets smaller toward the lower end from the upper end thereof. In other words, the inner side of the exhaust heat compensator 40 is sloped to correspond to the cross sectional shape of the wafer guide 30. In addition, the diameter of the lower end of the penetration hole 41 facing the wafer W is smaller than that of the wafer W. As a result, the exhaust heat compensator 40 is able to maintain a uniform temperature on the wafer surface by suppressing heat exhaustion from the edge area of the wafer.

Figure 5:
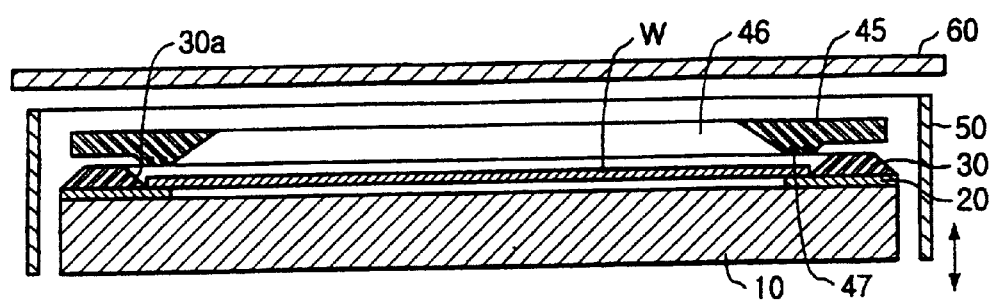
FIG. 5 illustrates a configuration of a baking apparatus according to another embodiment of the present invention.

FIG. 5 illustrates a configuration of a baking apparatus according to another embodiment of the present invention. The same parts between FIG. 3 and FIG. 5 specify the same symbols, thus explanations for them will be omitted.

An exhaust heat compensator 45 can move up and down and a penetration hole 46 in the inside of the exhaust heat compensator 45 is employed to expose the wafer to the air. The diameter of an upper end of the penetration hole 46 facing the cover 60 is smaller than that of the lower end of the penetration hole 46 facing the wafer W. The diameter of the lower end of the penetration hole 46 facing the wafer W is smaller than that of the wafer W, which is effective for compensating the heat exhausted from the edge area of the wafer W.

The bottom side of the exhaust heat compensators 40 and 45 illustrated in FIG. 3 and FIG. 5 includes grooves corresponding to the slope 30a in the wafer guide 30, thus the exhaust heat compensators 40 and 45 approach to the wafer supporter 20 and the wafer guide 30 with a uniform distance.

Heating apparatuses 42 and 47 for compensating the heat exhausted from the edge area of the wafer W are installed in the inside of the bottom area in the exhaust heat compensators 40 and 45 facing the wafer W. It is preferable that heating apparatuses employ any electric heater controlling temperatures easily. Such heating apparatuses 42 and 47 control temperature distributions in the edge area of the wafer W, and controllers (not shown in FIG. 3 and FIG. 5) can be employed to control temperatures of the heating apparatuses 42 and 47 if necessary.

The semiconductor wafer baking apparatus with such configurations employs the slope 30a in the wafer guide to arrange the wafer W on the wafer supporter 20 after the wafer transfer arm (not shown in FIG. 3 and FIG. 5) loads the wafer on the heating plate 10. Then, the chamber body 50 moves up and the cover 40 moves down. The exhaust heat compensators 40 and 45 also move down. In other words, even though the wafer W is not loaded on the wafer supporter 20 exactly, the slope 30a of the wafer guide 30 arrange the wafer effectively and the wafer W is not moved.

When the wafer W is loaded in the wafer supporter 20, the chamber body 50 moves up and the cover 60 moves down. The exhaust heat compensator 40 and 45 also move down. Then, the exhaust heat compensator 40 and 45 approach to the wafer W and the wafer guide with a uniform distance.

The following process heats up the heating plates 10 to a desired temperature and bakes the wafer W loaded in the wafer supporter 20 by the heat transferred from the heating plate 10.

When the heating plate 10 is heated up, the heating apparatuses 42 and 47 installed within the exhaust heat compensators 40 and 45 are also turned on and heated up by the controllers. Then, the heat transferred from the heating apparatuses 42 and 47 compensates the heat exhausted from the edge area of the wafer W. As a result, the temperature distributions on the surface of the wafer W are uniform through out the center and edge area of the wafer W by the heating plate 10 and by the exhaust heat compensators 40 and 45.

After baking the wafer W, the chamber body 50 moves downward and the cover 60 moves upward. The exhaust heat compensators 40 and 45 also move upward. The wafer transfer arm extracts the baked wafer W. The above-mentioned operations are performed in repeat to bake other wafers.

The corresponding area to the edge area of the wafer W in the exhaust heat compensator 45 illustrated in FIG. 5 is less than that in the exhaust heat compensator 40 illustrated in FIG. 3. However, the exhaust heat compensator 45 in FIG. 5 compensates the heat exhausted from the edge area of the wafer W not only by the heating apparatus 47, but also by using aerodynamic flows.

Figure 6A:
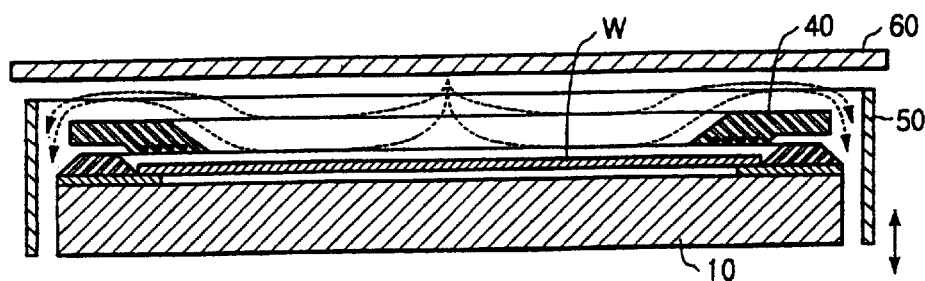
FIG. 6a illustrates imaginary aerodynamic flows in the baking apparatus as shown in FIG. 3.

FIG. 6a illustrates imaginary aerodynamic flows in the baking apparatus as shown in FIG. 3. The diameter of the lower end of the penetration hole 41 in the exhaust heat compensator 40 is smaller than that the upper end so that the aerodynamic flows within the baking apparatus are generated naturally from the center to the edge area of the wafer W.

Figure 6B:
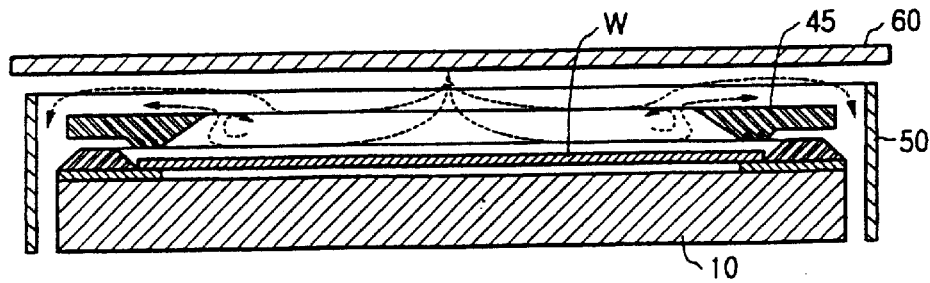
FIG. 6b illustrates imaginary aerodynamic flows in the baking apparatus as shown in FIG. 5.

FIG. 6b illustrates imaginary aerodynamic flows in the baking apparatus as shown in FIG. 5. In FIG. 6a, however, the diameter of the lower end of the penetration hole 41 formed in the exhaust heat compensator 40 is larger than that of the upper end. Therefore, the aerodynamic flows within the baking apparatus moving from the center to the edge area of the wafer W generate turbulent flows or stagnant flows in the edge area of the wafer W, which are more efficient to compensate the temperature of the edge area of the wafer W.

The temperature in the center area of the wafer W is influenced by the heating plate 10, and the temperature in the edge area of the wafer W is influenced by the exhaust heat compensator 40 and 45 rather than by the heating plate 10. Therefore, the temperature of the wafer W can be uniformly maintained by compensating the heat exhausted from the edge area of the wafer W.

Figure 7A:
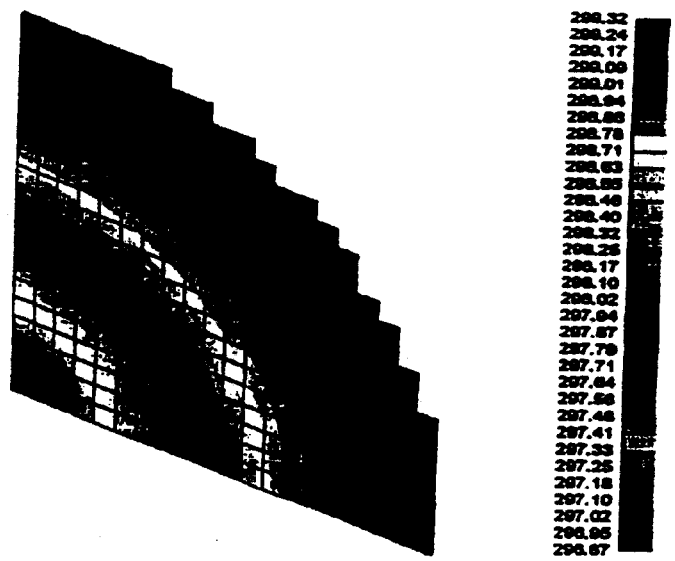
FIG. 7a illustrates temperature distributions of a 200 mm wafer in the baking process by the baking apparatus as shown in FIG. 3.
Figure 7B:
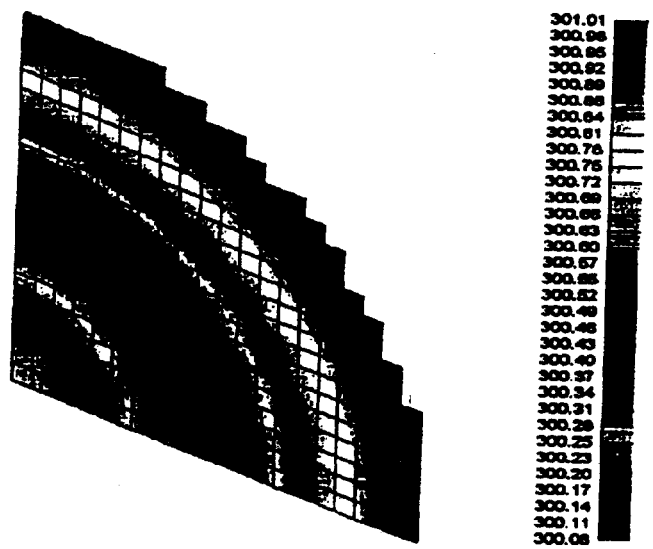
FIG. 7b illustrates temperature distributions of a 200 mm wafer in the baking process by the baking apparatus as shown in FIG. 5.
Figure 9A:
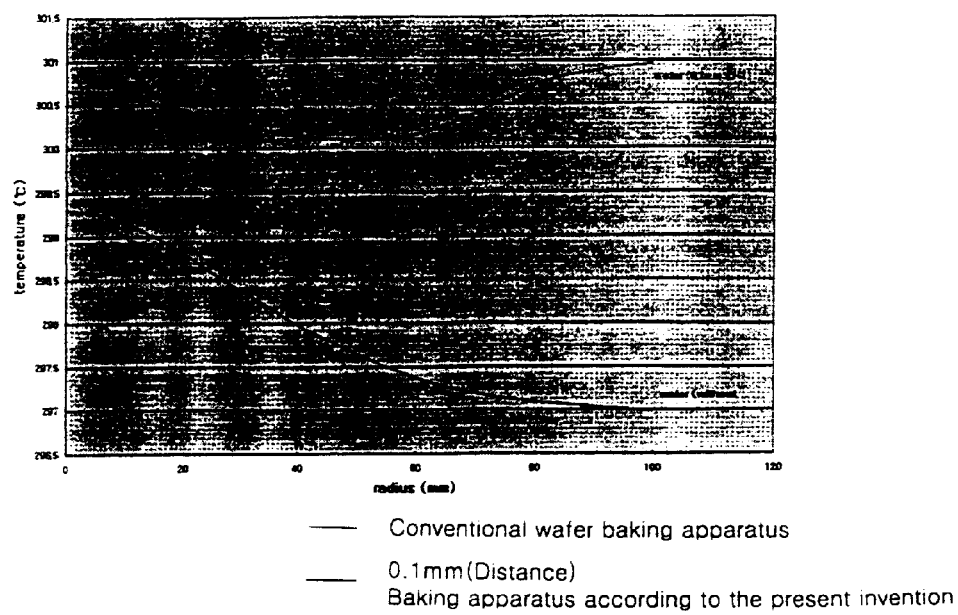
FIG. 9a illustrates temperature distributions of a 200 mm wafer in a baking process by the first embodied baking apparatus according to the present invention and by the conventional baking apparatus.

Simulation results for the semiconductor wafer baking apparatus according to the present invention are shown in FIG. 7a, FIG. 7b, FIG. 9a and Table 1. FIG. 7a, FIG. 7b and Table 1 illustrate the temperature deviation versus position of a 200 mm wafer in a baking process.

TABLE 1

|  | conventional art | | present invention | |
| --- | --- | --- | --- | --- |
|  | Tmax | Tmin | Tmax | Tmin |
| 200 mm wafer | 299.32° C. | 296.87° C. | 300.95° C. | 300.09° C. |
| ΔT (Tmax − Tmin) | 2.45° C. | | 0.86° C. | |
| Temperature Deviation Ratio | 100% | | 35% | |

Referring to FIG. 7a, FIG. 7b and Table 1, simulation results to the conventional semiconductor wafer baking apparatus show that the maximum temperature Tmax in the center of the 200 mm wafer is 299.3° C., the minimum temperature Tmin in the edge area of the wafer is 296.87° C., and the temperature deviation ΔT is 2.45° C. Simulation results to the baking apparatus according to the present invention show that the maximum temperature Tmax in the center of the 200 mm wafer is 300.95° C., the minimum temperature Tmin in the edge area of the wafer is 300.09° C., and the temperature deviation ΔT is 0.86° C.

Comparing these results shows that the temperature deviation in the semiconductor wafer baking apparatus according to the present invention is about 35%, assuming that the temperature deviation in the conventional semiconductor wafer baking apparatus is 100%. Therefore, the temperature deviation according to the present invention is greatly lowered, so that the temperature of the wafer surface can be uniformly maintained.

Figure 8A:
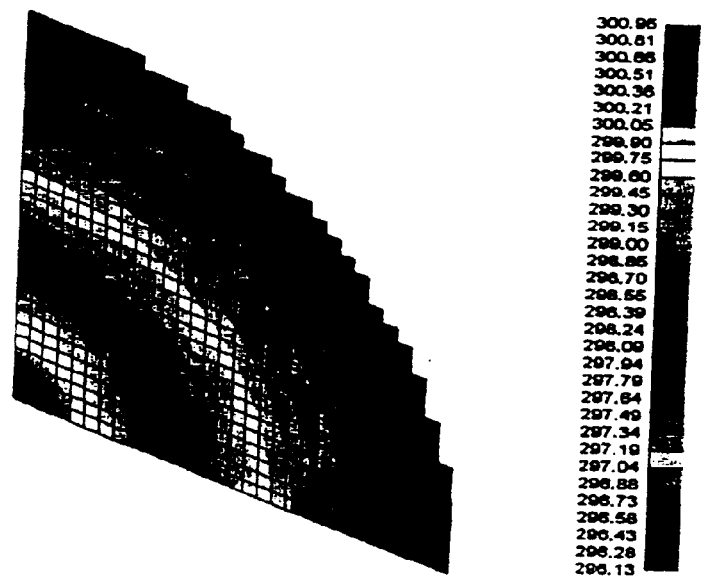
FIG. 8a illustrates temperature distributions of a 300 mm wafer in the baking process by the baking apparatus as shown in FIG. 3.
Figure 8B:
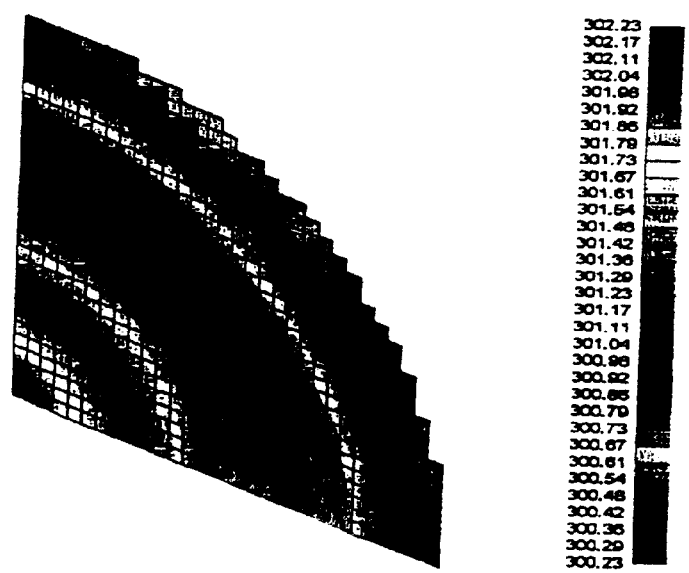
FIG. 8b illustrates temperature distributions of a 300 mm wafer in the baking process by the baking apparatus as shown in FIG. 5.
Figure 9B:
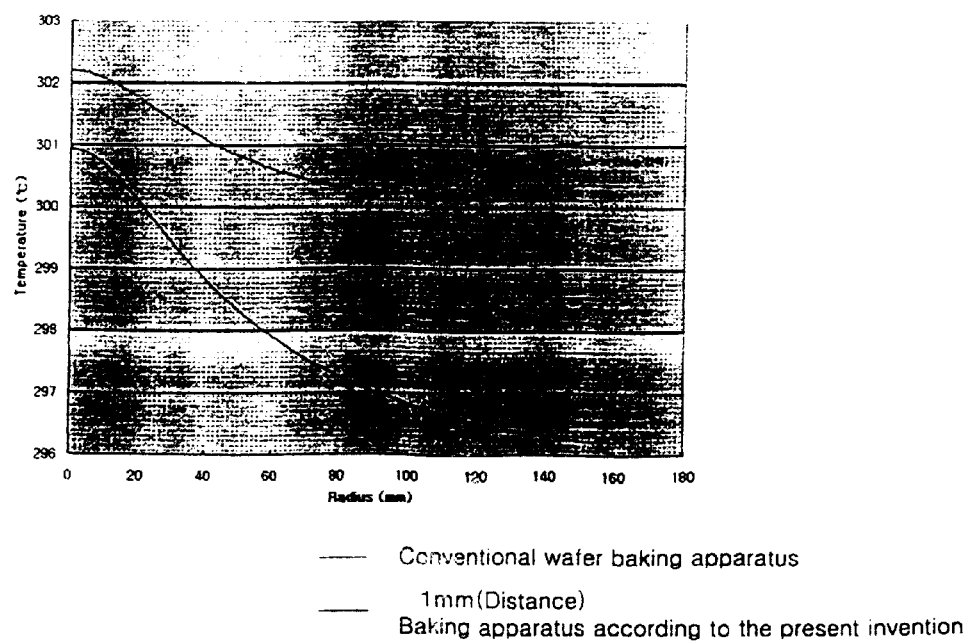
FIG. 9b illustrates temperature distributions of a 300 mm wafer in a baking process by the baking apparatus as shown in FIG. 3 and by the conventional baking apparatus as shown in FIG. 1.

As the size of the wafer gets bigger, the value of the temperature deviation is considered as being more important. FIG. 8a, FIG. 8b and FIG. 9b show temperature deviations in a 300 mm wafer. Table 2 illustrates the results of comparison analysis for the temperature deviations in the 300 mm wafer.

TABLE 2

|  | conventional art | | present invention | |
| --- | --- | --- | --- | --- |
|  | Tmax | Tmin | Tmax | Tmin |
| 300 mm wafer | 300.96° C. | 296.13° C. | 302.23° C. | 300.23° C. |
| ΔT (Tmax − Tmin) | 4.83° C. | | 2.00° C. | |
| Temperature Deviation Ratio | 100% | | 41% | |

Referring the FIG. 8a, FIG. 8b and Table 2, simulation results to the conventional semiconductor wafer baking apparatus show that the maximum temperature Tmax in the center of the 300 mm wafer is 300.96°C., the minimum temperature Tmin in the edge area of the wafer is 296.13° C., and the temperature deviation AT is 4.83° C. Simulation results to the baking apparatus according to the present invention show that the maximum temperature Tmax in the center of the 300 mm wafer is 302.23° C., the minimum temperature Tmin in the edge area of the wafer is 300.23° C., and the temperature deviation ΔT is 2.00° C.

Comparing these results shows that the temperature deviation in the semiconductor wafer baking apparatus according to the present invention is about 41%, assuming that the temperature deviation in the conventional semiconductor wafer baking apparatus is 100%. Therefore, temperature deviation of the semiconductor wafer baking apparatus according to the present invention is greatly improved.

Figure 10:
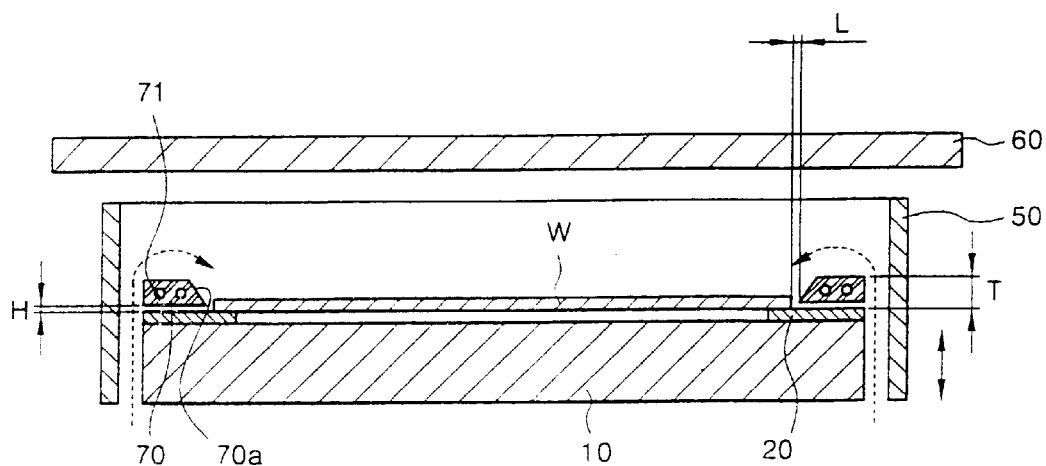
FIG. 10 illustrates a configuration of a baking apparatus according to still another embodiment of the present invention.
Figure 11:
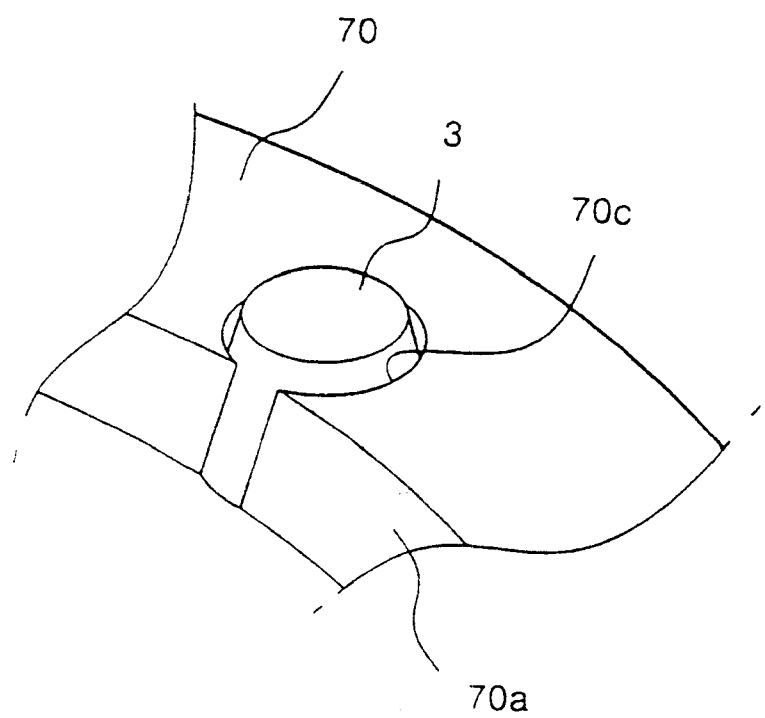
FIG. 11 is a diagram illustrating an enlarged view of the exhaust heat compensator as shown in FIG. 10.

FIG. 10 illustrates a configuration of a baking apparatus according to still another embodiment of the present invention. Functions and operations of the baking apparatus will be described. Same symbols are specified to the same parts illustrated in FIG. 3 and FIG. 5 and explanations for them will be omitted.

An exhaust heat compensator 70 illustrated in FIG. 10 is installed in the top side of the wafer supporter 20 and surrounds the edge area of the wafer W. A temperature controller can be employed to heat the heating plate 10 and the exhaust heat compensator 70. A power unit (not shown in FIG. 10) can apply a power simultaneously or independently to the heating plate 10 and the exhaust heat compensator 70. A distance H can be adjusted.

The distance H is adjusted to prevent temperature interferences between the heating plate 10 and the exhaust heat compensator 70, and to maintain their temperatures separately. Also, by adjusting the distance H, the distance T from the heating plate 10 to the top side of the exhaust heat compensator 70 can be varied, and proper aerodynamic flows can be induced to achieve optimum conditions of temperature compensations.

The exhaust heat compensator 70 comprises doughnut type rings with a predetermined width and a predetermined thickness. The inner circumference of the compensator 70 has a slope 70a inclined to the center of the compensator 70 in a gradient, and a heating apparatus 71 is installed in the inside of the compensator 70. It is preferable that the heating apparatus 71 employs any electric heater for controlling temperatures easily.

In the case of a plurality of the wafer guides 30, it is preferable that the exhaust heat compensator 70 comprises a plurality of insertion holes 70c. The insertion holes 70c are formed in inner circumference of the exhaust heat compensator 70, and the inner side of the insertion holes 70c is open.

A heat insulator 80 can be placed additionally on the bottom side of the exhaust heat compensator 70 to prevent heat interferences between the heating plate 10 and the exhaust heat compensator 70.

In the semiconductor wafer baking apparatus as shown in FIG. 10, a wafer transfer arm (not shown) loads the wafer W on the top side of the heating plate 10 in the same way as described above for wafer baking apparatuses with reference to FIG. 3 and FIG. 5. Then, the chamber body 50 moves downward and the cover 50 moves upward.

Even though the wafer W is not properly placed, the wafer W is slid into the wafer supporter 20 to be properly arranged by the slope 70a of the exhaust heat compensator 70 or by the outside of the wafer guide 3. Therefore, the distance L between the wafer W and the exhaust heat compensator 70 is constant.

A plurality of the wafer guides 30 reducing the contact area with the wafer W is more effective for the wafer W to be slid on the wafer supporter than a ring type wafer guide.

The following process is to load the wafer W on the wafer supporter 20. Then, the chamber body 50 moves upward and the cover 60 moves downward. The heating plate 10 is heated up to a desired temperature and bakes the wafer W loaded on the wafer supporter 20.

When the heating plate 10 is heated up, the exhaust heat compensator 70 heated up to a predetermined temperature compensates the temperature of the edge area of the wafer W. In this case, the exhaust heat from the edge area of the wafer W is more than that form any other position of the wafer W. In more detail, the edge area of the wafer W exhausts more heat than the center of the wafer W. The temperature is gradually lowered toward the edge area from the center on the wafer surface. Then, aerodynamic flows by the exhaust heat compensator 70 and heating effects by the heating apparatus 71 in the inside of the exhaust heat compensator 70 compensate the exhausted heat.

Therefore, the baking apparatus according to the present invention raises the temperature in the edge area of the wafer W comparing with the center of the wafer W and the temperature distributions of the wafer W becomes uniform.

The exhaust heat compensator 70 is installed to surround the wafer W with a distance T from the heating plate 10. Therefore, the cold air from the outside flows to the arrow direction illustrated in FIG. 10 from the side of the heating plate 10 to the top side of the exhaust heat compensator 70 so that the cold air cannot contact the wafer W directly, which results in reducing the heat loss comparing with the conventional semiconductor wafer baking apparatus.

The exhaust heat compensator 70 installed with a height T converts the air layer inducing heat loss in the edge area of the wafer W to an insulating layer supplying heat uniformly to the wafer W. As a result, the heat transferred from the heating plate 10 and the exhaust heat compensator 70 to the wafer W becomes uniform. Such an insulating layer is effective to prevent a rapid temperature change in the heating plate 10 and the exhaust heat compensator 70, which results in preventing the rapid temperature change in the surface of the wafer W.

The exhaust heat compensator 70 is installed with a distance H on the heating plate 10 so that temperature interferences between the heating plate 10 and the exhaust heat compensator 70 can be prevented.

Adjusting the distance H can change reversibly the distance T from the top side of the heating plate 10 to the top side of the exhaust heat compensator 70 so that aerodynamic flows satisfying the optimum conditions of the temperature compensation can be induced.

In experiments to the semiconductor wafer baking apparatus according to the present invention, the following Table 3 shows simulation results of temperature distributions on the surface of the wafer W in the condition of simply shaping models of the heating plate 10 and the exhaust heat compensator 70. Table 3 illustrates maximum changes of temperature differences on the surface of the wafer W according to the distance T and the distance L of the exhaust heat compensator 70.

TABLE 3

| L(mm) | T(mm) | | | | | |
|---|---|---|---|---|---|---|
| | 0 | 1 | 2 | 3 | 5 | 10 |
| 1 | 1.16 | 1.01(13.0%) | 0.98(15.5%) | 0.99(14.6%) | 1.07(4.4%) | 1.99(−71.5%) |
| 5 | | 1.12(3.4%) | 1.13(2.5%) | 1.14(1.7%) | 1.19(−2.5%) | 1.98(−70.6%) |
| 10 | | 1.16(0.0%) | 1.18(−1.7%) | 1.18(−1.7%) | 1.24(−6.8%) | 1.88(−62.0%) |

The value in % of parentheses in Table 3 illustrates the reducing ratio in the maximum temperature difference in the case that the exhaust heat compensator is not equipped. The maximum temperature difference is the least value when the distance T of the compensator 70 is 2 mm and the distance L is 1 mm and the reducing ratio is 15.5% comparing with the case that the compensator 70 is not equipped.

Figure 1:
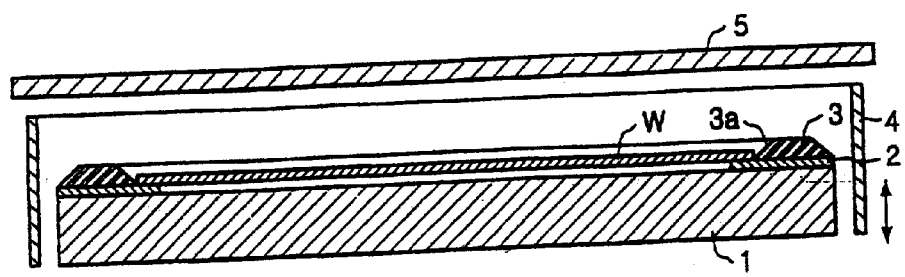
FIG. 1 illustrates a configuration of a conventional baking apparatus.
Figure 2:
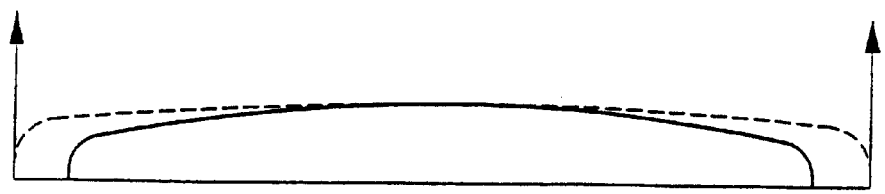
FIG. 2 is a graph illustrating temperature distributions in a wafer loaded in the conventional baking apparatus of FIG. 1.
Figure 12:
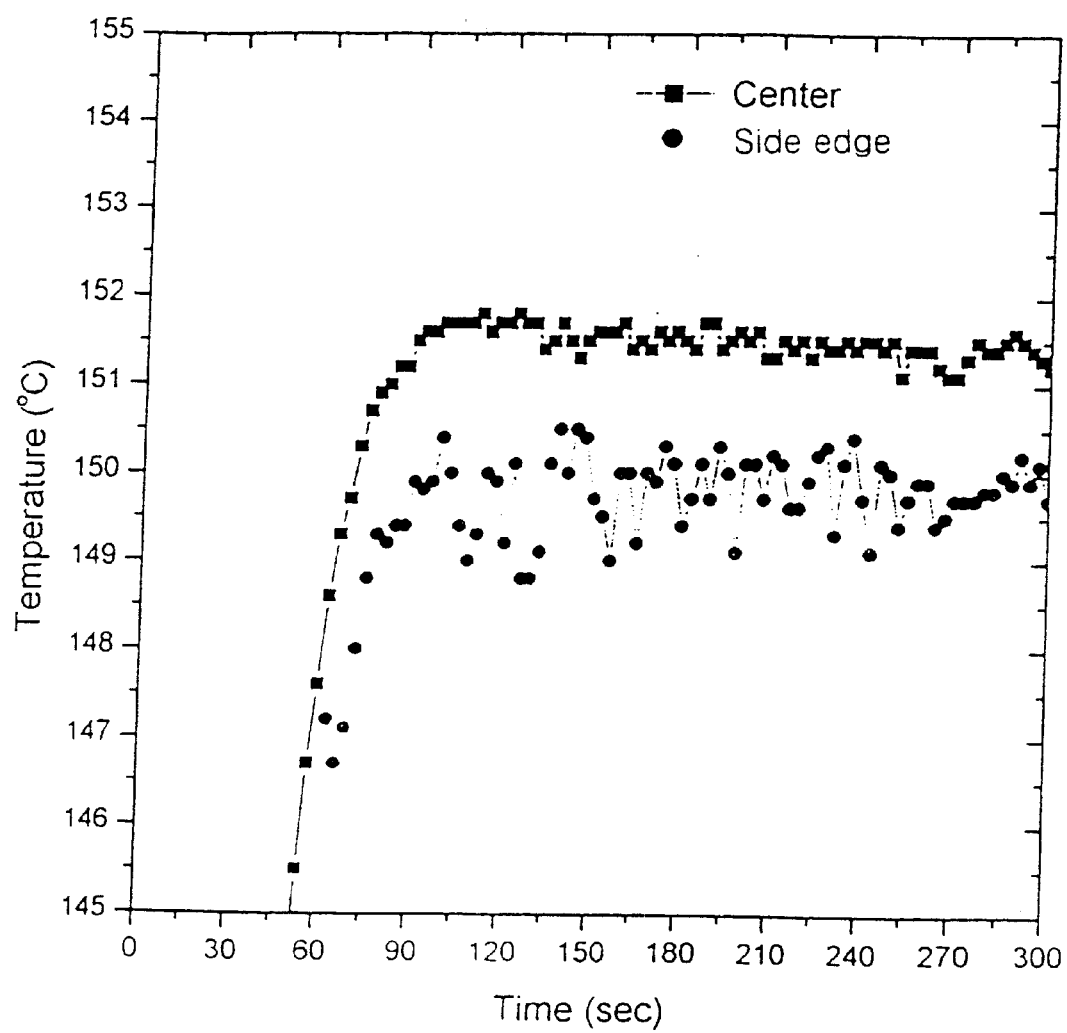
FIG. 12 is a graph illustrating temperatures of the center and of the edge area on a wafer surface versus time for the conventional baking apparatus as shown in FIG. 1.

FIG. 12 is a graph illustrating temperatures of the center and of the edge area in a wafer surface versus time for the conventional baking apparatus as shown in FIG. 1.

The line of the black squared symbol ■ in FIG. 12 illustrates temperature changes on the center of the wafer surface and the line of the black rounded symbol ■ illustrates temperature changes on the edge area of the wafer surface. As illustrated in FIG. 12, the temperature is maintained almost constantly between 120 seconds and 300 seconds after the temperature rising process. The average temperature in the center of the wafer is about 151.47° C., the average temperature in the edge area of the wafer is about 149.80° C., and the difference between these average temperatures is about 1.67° C.

Figure 13:
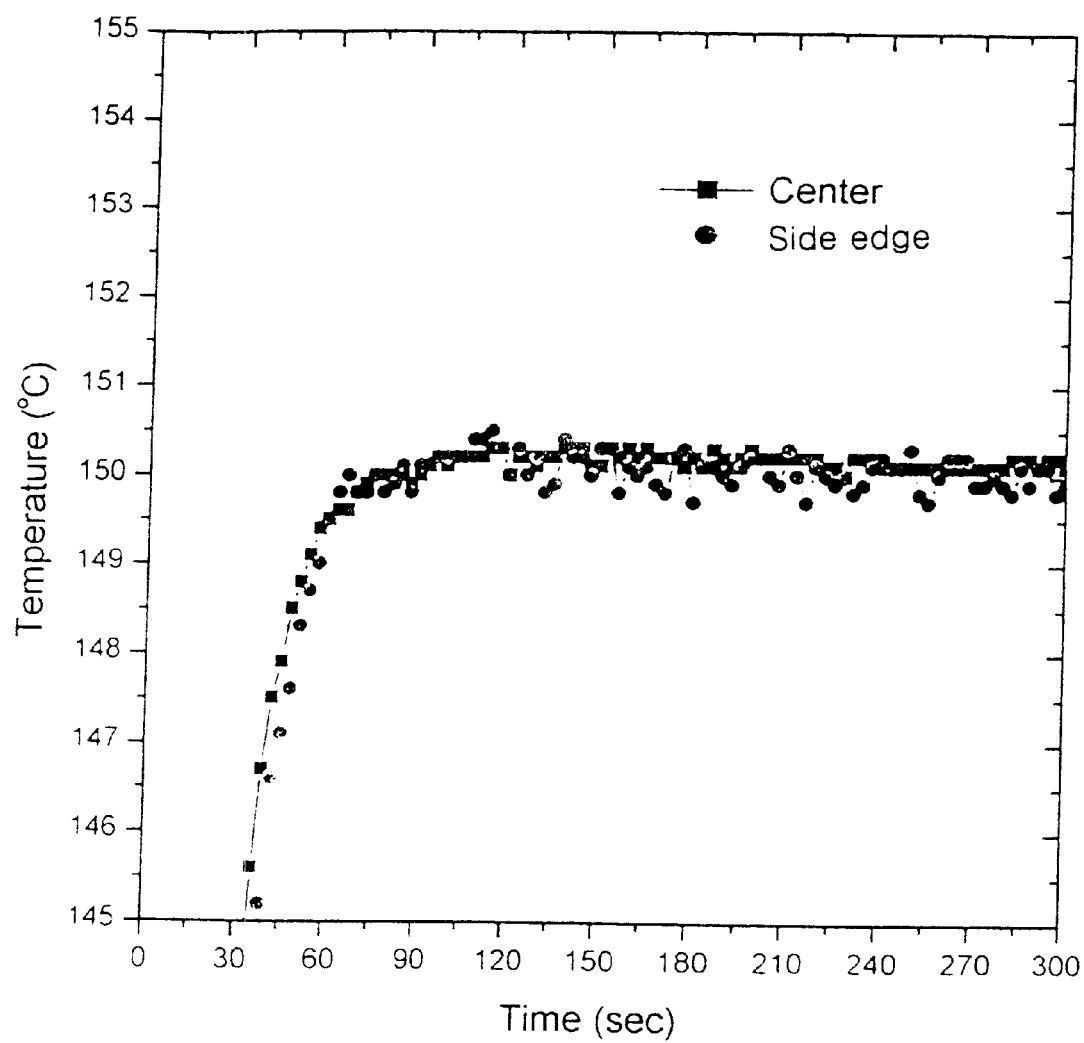
FIG. 13 is a graph illustrating temperatures of the center and of the edge area on a wafer surface versus time for the baking apparatus as shown in FIG. 10 in the condition that the cover 60 is closed.

FIG. 13 is a graph illustrating temperatures of the center and of the edge area on a wafer surface versus time for the baking apparatus as shown in FIG. 10 in the condition that the cover 60 is closed.

The line of the black squared symbol ■ in FIG. 13 illustrates temperature changes on the center of the wafer surface and the line of the black rounded symbol ■ illustrates temperature changes on the edge area of the wafer surface. As illustrated in FIG. 13, the average temperature in the center of the wafer is about 150.17° C., the average temperature in the edge area of the wafer is about 150.03° C., and the difference between the average temperatures is about 0.14° C. between process times of 120 to 300 seconds.

When comparing the average temperature differences between FIG. 12 and FIG. 13, the average temperature difference in the baking apparatus according to the present invention is 8.4% assuming that the average temperature difference in the conventional baking apparatus is 100%.

In the semiconductor wafer baking apparatus according to the present invention, heating the heating plate 10 and the exhaust heat compensator 70 simultaneously can change the temperature of the heating plate 10. To prevent the temperature change of the heating plate 10, junction points between the exhaust heat compensator 70 and the heating plate 10 are insulated to interrupt temperature interferences between the heating plate 10 and the exhaust heat compensator 70.

Figure 14A:
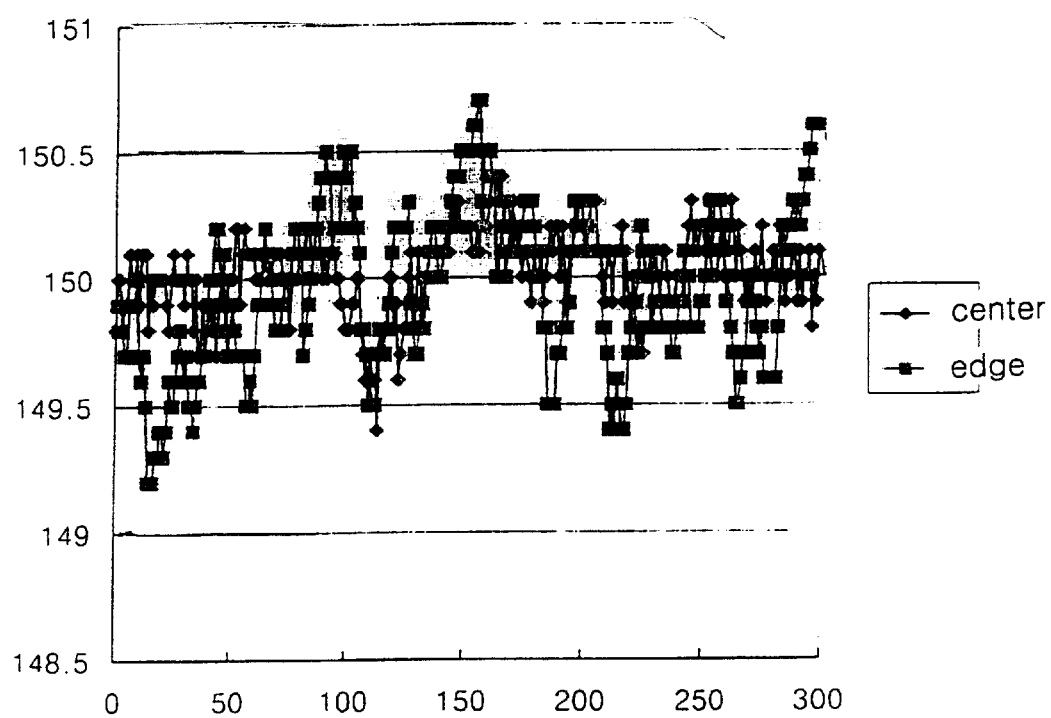
FIG. 14a is a graph illustrating temperatures of the center and of the edge area on a wafer surface versus time for the baking apparatus as shown in FIG. 10 in the condition that the cover 60 is closed and aerodynamic exhaust flows in the chamber body are upward.
Figure 14B:
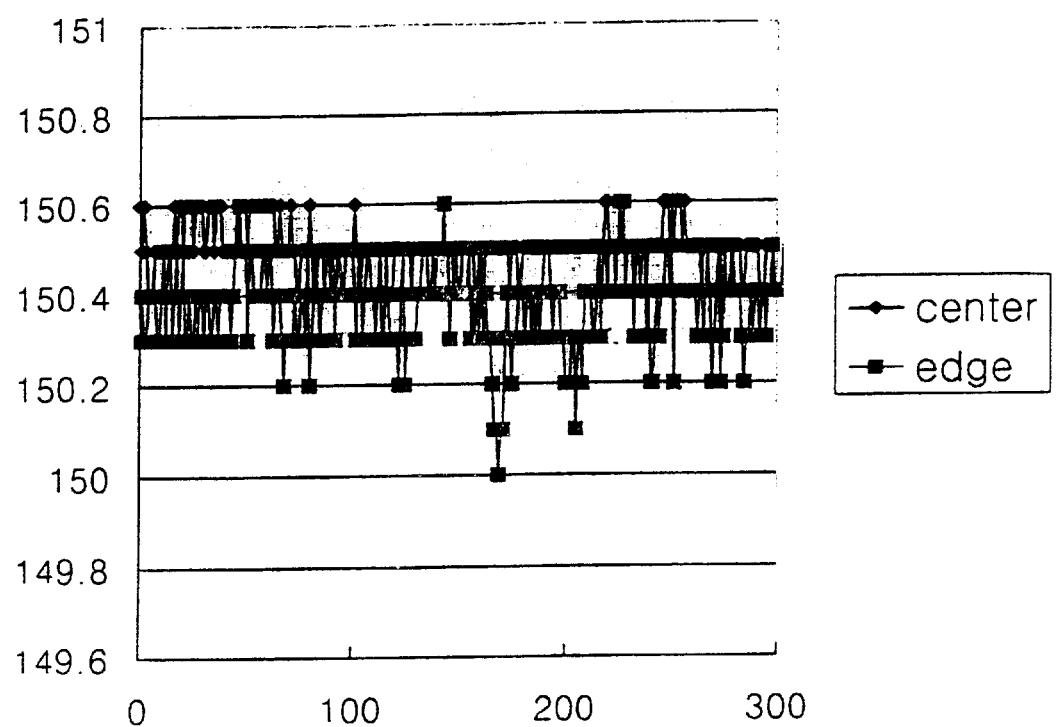
FIG. 14b is a graph illustrating temperatures of the center and of the edge area on a wafer surface versus time for the baking apparatus as shown in FIG. 10 in the condition that the cover 60 is open and aerodynamic exhaust flows in the chamber body are upward.
Figure 14C:
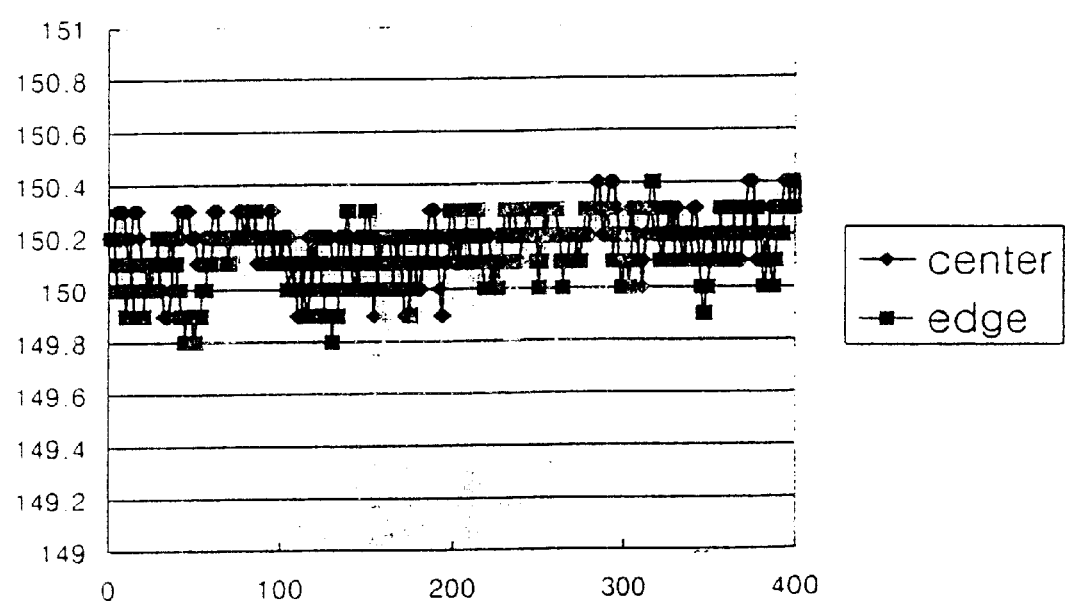
FIG. 14c is a graph illustrating temperatures of the center and of the edge area on a wafer surface versus time for the baking apparatus as shown in FIG. 10, in the condition that the cover 60 is closed and aerodynamic exhaust flows in the chamber body are upward, and one side of the chamber body transferring a wafer is open.

FIG. 14a is a graph illustrating temperatures of the center and of the edge area in a wafer surface versus times in second in employing the baking apparatus as shown in FIG. 10 in the condition that the cover 60 is closed and aerodynamic exhaust flows in the chamber body are upward. FIG. 14b is a graph illustrating temperatures of the center and of the edge area on a wafer surface versus time for the baking apparatus as shown in FIG. 10 in the condition that the cover 60 is open and aerodynamic exhaust flows in the chamber body are upward. FIG. 14c is a graph illustrating temperatures of the center and of the edge area on a wafer surface versus time for the baking apparatus as shown in FIG. 10, in the condition that the cover 60 is closed and aerodynamic exhaust flows in the chamber body are upward, and one side of the chamber body transferring a wafer is open.

With x-axis of times, the line of the black diamond symbol ♦ illustrates the temperature changes in the center of the wafer surface and the line of the black square symbol ■ illustrates the temperature changes in the edge area of the wafer surface.

The average temperature in the center of the wafer in each of the graphs 14a, 14b, and 14c is 150.11° C., 150.48° C., and 150.18° C., respectively. The average temperature in the edge area of the wafer in each of the graphs 14a, 14b, and 14c is 150.14°C., 150.36° C., and 150.15° C., respectively. Therefore, the average temperature difference between the center and the edge area of the wafer in each of the graphs 14a, 14b, and 14c is 0.03° C., 0.13° C., and 0.03° C., respectively.

FIG. 13 is a graph illustrating test results in the condition that aerodynamic exhaust flows in the chamber body 50 to the upward direction are not formed and the cover 60 is closed. On the contrary, FIG. 14a, 14b, and 14c are graphs illustrating test results in the condition that aerodynamic exhaust flows in the chamber body 50 are upward and each of the additional different test conditions are included in each of the graphs, individually.

Therefore, the semiconductor wafer baking apparatus according to the present invention compensates the heat loss occurring in the edge area of the wafer and keeps the edge area of the wafer from the temperature drop, which results in a temperature uniformity on the wafer surface.

By reducing the temperature deviation within a wafer, a uniform pattern size of all an entire wafer in the semiconductor wafer manufacturing process is achieved so that the process reliability and the process yields can be improved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor wafer baking apparatus comprising:
   a heating plate for heating a wafer;
   a wafer guide for arranging the wafer on or above the heating plate; and
   an exhaust heat compensator placed on the wafer guide and for compensating exhausted heat from an edge area of the wafer, the exhaust heat compensator comprising a penetration hole to expose a center portion of the wafer.

2. The semiconductor wafer baking apparatus according to claim 1, wherein an upper end diameter of the penetration hole is larger than a lower end diameter of the penetration hole.

3. The semiconductor wafer baking apparatus according to claim 1, wherein an upper end diameter of the penetration hole is smaller than a lower end diameter of the penetration hole.

4. The semiconductor wafer baking apparatus according to claim 2, wherein the lower end diameter of the penetration hole is smaller than the diameter of the wafer.

5. The semiconductor wafer baking apparatus according to claim 3, wherein the lower end diameter of the penetration hole is smaller than the diameter of the wafer.

6. The semiconductor wafer baking apparatus according to claim 1, wherein the wafer guide comprises a slope to be in contact with the wafer.

7. The semiconductor wafer baking apparatus according to claim 6, wherein the exhaust heat compensator comprises grooves corresponding to the slope of the wafer guide such that the exhaust heat compensator approach the wafer and the wafer guide with a uniform distance.

8. The semiconductor wafer baking apparatus according to claim 1, further comprising a heater in an inside of the exhaust heat compensator facing the edge area of the wafer.

9. The semiconductor wafer baking apparatus according to claim 1, further comprising a wafer supporter for supporting the wafer such that the wafer is spaced from the heating plate.

10. The semiconductor wafer baking apparatus according to claim 9, wherein the wafer supporter is integrated with the wafer guide.

11. A semiconductor wafer baking apparatus comprising:

a heating plate for heating a wafer to a predetermined temperature; and an exhaust heat compensator placed above the heating plate to surround an edge area of the wafer, to compensate a temperature of the edge area of the wafer;

wherein the exhaust heat compensator includes a doughnut type ring and a sloped inner circumference.

12. The semiconductor wafer baking apparatus according to claim 11, further comprising an adjustable gap between the exhaust heat compensator and the heating plate.

13. The semiconductor wafer baking apparatus according to claim 11, further comprising a heater in the inside of the exhaust heat compensator.

14. The semiconductor wafer baking apparatus according to claim 13, wherein the heating plate and the exhaust heat compensator are controlled separately.

15. The semiconductor wafer baking apparatus according to claim 13, further comprising a heat insulator in the bottom side of the exhaust heat compensator to prevent temperature interferences between the heating plate and the exhaust heat compensator.

16. The semiconductor wafer baking apparatus according to claim 11, further comprising a wafer supporter between the heating plate and the exhaust heat compensator.

* * * * *